United States Patent [19]

Church et al.

[11] 3,909,325

[45] Sept. 30, 1975

[54] POLYCRYSTALLINE ETCH

[75] Inventors: Clyde L. Church, Tempe, Ariz.; James W. Smith, II, Santa Ana, Calif.

[73] Assignee: Motorola, Inc., Chicago, Ill.

[22] Filed: June 28, 1974

[21] Appl. No.: 484,375

[52] U.S. Cl. ........................ 156/17; 29/571; 29/580; 156/11; 252/79.5

[51] Int. Cl.² ............................................ H01L 7/50

[58] Field of Search .......... 156/11, 17; 29/571, 580; 252/79.5

[56] References Cited

UNITED STATES PATENTS

| | | | |
|---|---|---|---|
| 2,738,259 | 3/1956 | Ellis | 156/17 X |
| 3,506,509 | 4/1970 | Kragness et al. | 252/79.5 |
| 3,579,057 | 5/1971 | Stoller | 317/234 |

FOREIGN PATENTS OR APPLICATIONS

| | | | |
|---|---|---|---|
| 976,559 | 11/1964 | United Kingdom | 156/17 |

*Primary Examiner*—William A. Powell
*Attorney, Agent, or Firm*—Vincent J. Rauner; Willis E. Higgins

[57] ABSTRACT

The mixture of potassium hydroxide, ethylene glycol and water is used at an elevated temperature to etch polycrystalline silicon and single crystalline silicon. Isopropyl alcohol is used to wet the surface of the polycyrstalline silicon immediately prior to etching with the above solution. This improves the etch uniformity due to immediate intimate contact of the etchant with the silicon surface. The etch rate of the polycyrstalline silicon and monocrystalline silicon is changed by varying the temperature of the mixture and/or the percentage of the water in the mixture. The etched angle at which the polycrystalline silicon is etched varies between 65° to 89°C by varying the temperature of the mixture and/or the percentage of the water.

6 Claims, 6 Drawing Figures

POLYCRYSTALLINE ETCH

BACKGROUND OF THE INVENTION

The formation of a polycrystalline silicon gate is well known in the industry. Such fabrication process begins with establishing a gate oxide layer on the surface of the structure followed by a polycrystalline silicon layer. Thereafter, by various mechanisms, the polycrystalline silicon gate itself is defined by etching away all but the polycrystalline silicon in the desired gate position. In etching the polycrystalline silicon layer by the prior art, it is common to use a nitric-hydrofluoric acid mixture. The surface oxide layer is stripped away except that portion under the polycrystalline gate. This stripping of the surface oxide layer undercuts the polycrystalline silicon gate. In stripping away this oxide layer, it is common to use HF etches. Thereafter, the establishment of a surface passivating layer over the entire structure causes physical stresses to be applied to the gate structure itself, which gate structure often cracks and falls into the area of the undercut. Additionally, a gate to drain or gate to source short occurs. Also, the passivating layer does not perform the function of covering the step properly, causing further problems of processing subsequent layers of the device.

SUMMARY OF THE INVENTION

It is an object of the present invention to provide an improved etchant for use in the manufacture of semiconductor devices.

It is a further object of the present invention to provide an improved etchant for use on polycrystalline silicon and moncrystalline silicon material.

It is another object of the present invention to provide an improved etchant having an etch rate which is varied by changing the temperature of the mixture and/or the percentage of water in the mixture.

It is a still further object of the invention to provide an etchant for polycrystalline silicon wherein the angle of etch of the polycrystalline silicon is variable by controlling the temperature of the mixture and/or the percentage of the water in the mixture.

Another object of the present invention is to provide a new process for etching polycrystalline silicon gate electrodes on MOS structure.

BRIEF DESCRIPTION OF THE INVENTION

The present invention is directed to a new etchant comprising potassium hydroxide, ethylene glycol and water for etching polycrystalline and monocrystalline silicon. This etchant is also suitable for etching gallium arsenide, gallium phosphide and gallium arsenide phosphide as well as germanium. It has been determined that varying the amount of water in the potassium hydroxide, ethylene glycol mixture, varies the etch rate of material being etched. Also, varying the temperature of the mixture also varies the etch rate of the material being etched. Specifically, for a polycrystalline silicon material, varying the temperature of the mixture or the percentage of water in the mixture also varies the angle of etching the polycrystalline silicon material. This latter feature, i.e., varying the angle of etching the polycrystalline silicon material, is very important for improving the step coverage on the beveled surface of the polycrystalline silicon material.

DETAILED DESCRIPTION OF THE INVENTION

Figure 1:
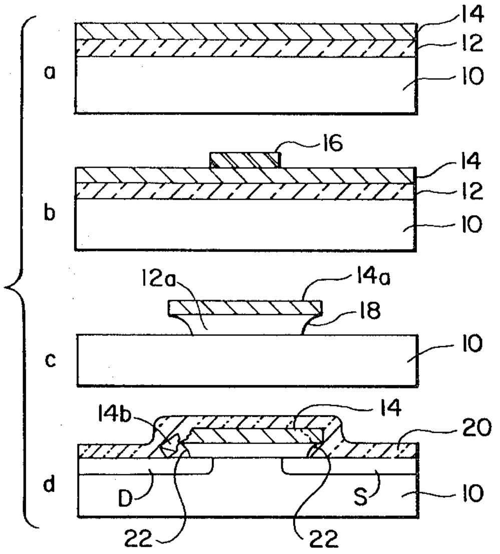
Fig. 1 PRIOR ART
FIG. 1 shows the prior art process steps *a* through *d* wherein a polycrystalline gate is defined which includes the undercutting of the gate electrode.

Referring to FIG. 1, Steps A and B, there is shown a substrate 10 upon which a gate oxide layer 12 and a polycrystalline layer 14 have been formed. A patterned photoresist layer is shown at 16 exposing a portion of the polycrystalline silicon layer 14 which is to be removed by etching. There are many well known ways for etching the polycrystalline layer 14 to form a polycrystalline portion 14*a* overlying the gate oxide portion 12*a*. Many of these are well known, and are available so it would not be necessary to illustrate how the polycrystalline layer is fashioned.

To etch the exposed portion of the polycrystalline layer 14, the structure is placed in a nitric HF etchant and then given a sulfuric acid clean. As shown in Step C, the polycrystalline layer has been substantially removed except for that portion 14*a* in overlying relationship to the gate oxide layer 12*a* which has been shown after the gate oxide layer has been etched.

During the removal of the polycrystalline layer, the surface of the first oxide layer 12 is partially etched so as to undercut the overlying polycrystalline layer. As the nitric HF attacks the oxide layer 12 vigorously, oftentimes it etches completely through the oxide exposing the substrate surface. This extreme case is shown in FIG. 1*c* wherein the oxide layer 12 suffers undercutting as at 18. Thereafter, at some later time in the processing, a surface passivating layer 20 is formed over the entire structure. Voids are left in the area 22 generally indicated as corresponding to the undercut region 18. Due to stress experienced by the structure and more particularly by the polycrystalline silicon gate element in the area 14*b*, the gate fractures and falls such as to short the gate electrode to the source or drain regions. In the left hand portion of Step *d* there is shown the fractured piece 14*b* resting against the drain and also still connected to the gate. In this manner there is a gate to drain short. This undercutting of the polycrystalline silicon gate portion such as to weaken the overlying cantilevered portion of the gate is a serious problem in the manufacture of polycrystalline silicon gate MOS devices.

Similar elements in the several views will be identified by the same numbers. This shows a correspondence between the present invention and the prior art.

Figure 2:
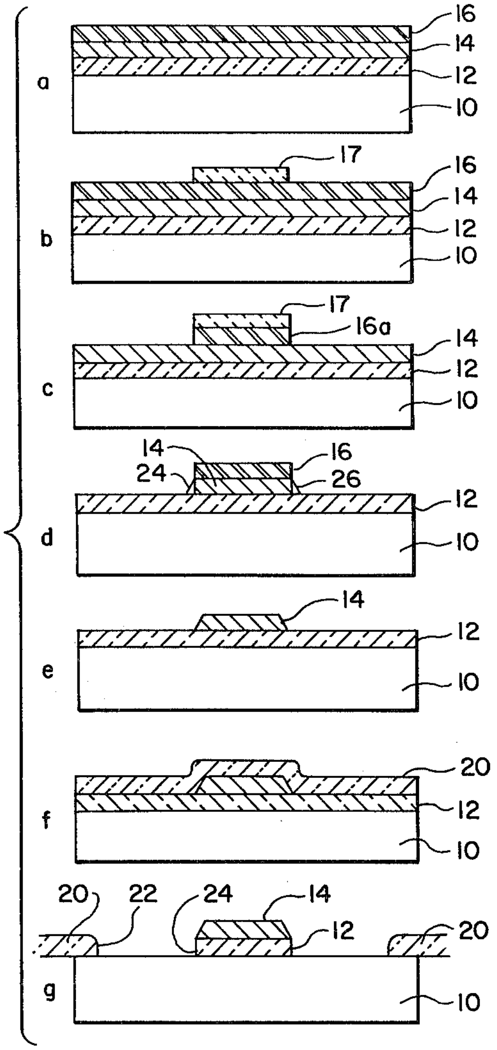
FIG. 2 shows process steps *a* through *g* wherein the polycrystalline silicon gate electrode is established with an edge having a slope for better metal and glass coverage.

Referring to FIG. 2, Steps *a* through *c*, there is shown a substrate 10 having an oxide layer 12 formed thereon. A polycrystalline layer is shown at 14 while a top oxide layer is shown at 16. A photoresist pattern 17 is formed by state of the art techniques for protecting the underlying portion 16*a* of the oxide layer 16. The oxide pattern 16*a* represents the portion where the final silicon gate will be located. Referring to Step *d*, there is shown the etching of the polycrystalline layer 14 using the etchant of the present invention. Attention is directed at the sloping surfaces 24 and 26 shown in Step *d*. This angle can vary from 65° to 89°C. The slope is determined by the temperature of the etchant and/or the percentage of water in the etchant. Thereafter, using the polycrystalline silicon as a mask, the oxide layer is removed as shown in Steps *e* and *f*. The gate oxide is shown at 12, the polycrystalline silicon gate is shown at 14. Thereafter, as shown in Step *f*, a surface passivating glass layer as shown at 20 covers the silicon gate electrode. The source and drain apertures 22 and 24 respectively are shown in FIG. *g*.

Figure 3:
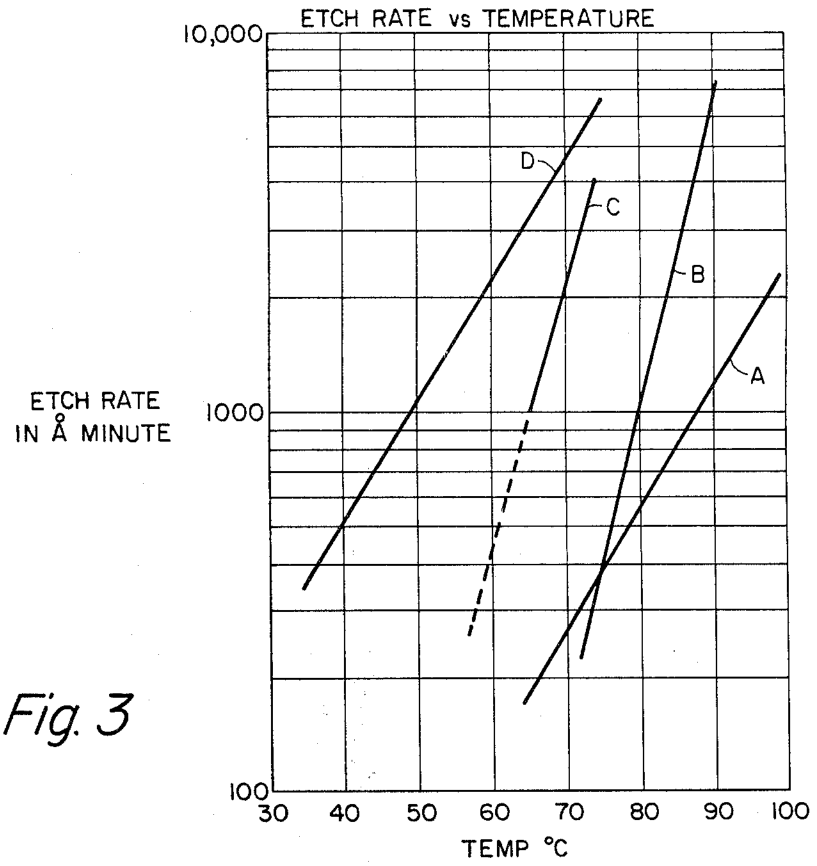
FIG. 3 shows the variation in polycrystalline etch rate versus temperature of the etchant solution.

Referring to FIG. 3 there is shown a graph illustrating the difference in etch rate versus the temperature of different etch mixtures A–D. The etch mixtures are given as follows and the etch rate of the mixtures A–D are shown in the graph by lines A–D respectively. Polysilica etchant mixtures are as follows:

A.
80g KOH pellets
500cc ethylene glycol

B.
80g KOH
1000cc ethylene glycol
25cc water

C.
80g KOH
500cc $H_2O$

D.
80g KOH
500cc $H_2O$
50cc ethylene glycol

Figure 4:
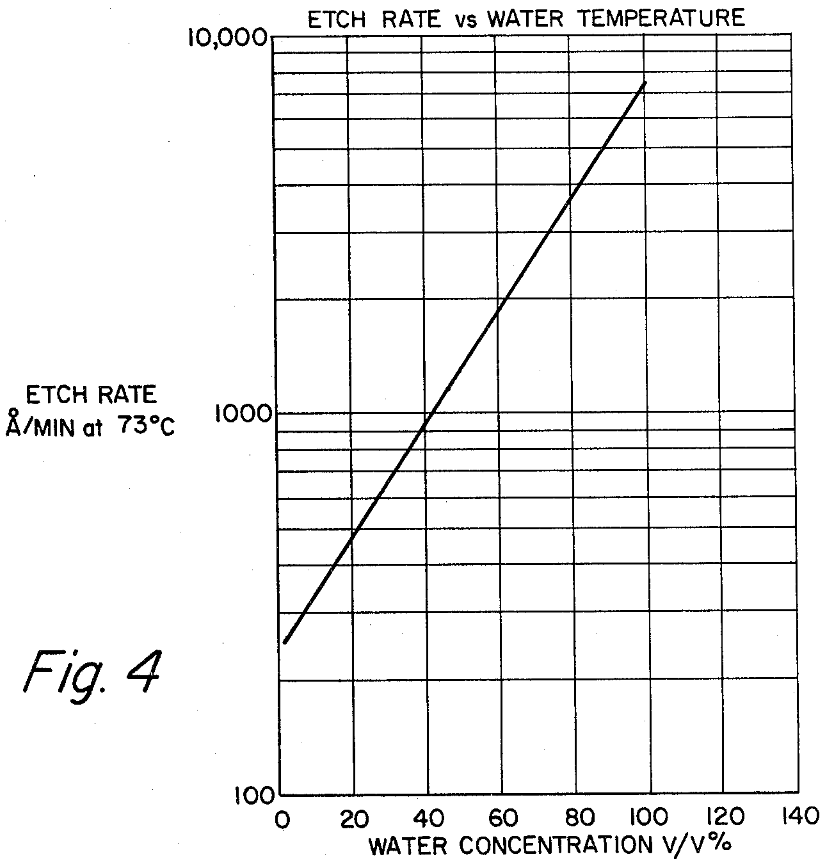
FIG. 4 shows the variation in polycrystalline etch rate versus percent of water in the etchant solution.

Referring to FIG. 4 there is shown the difference in the etch rate versus the percentage of water and the temperature of the solution. In general, a change in temperature of the mixture and a change of the percentage of water in the mixture both contribute to a difference in etch rate.

Figure 5:
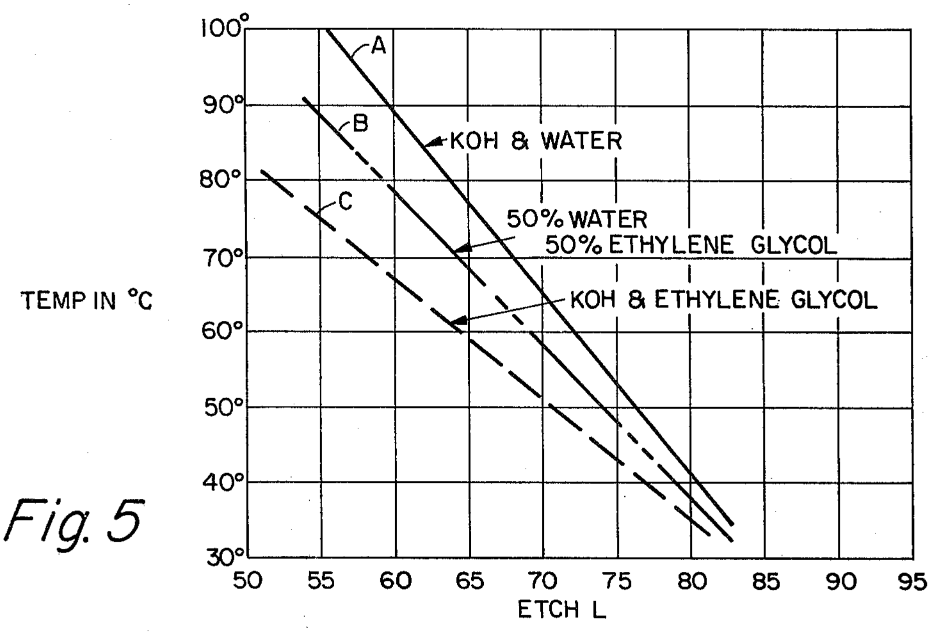
FIG. 5 shows the variation in etch angle versus temperature of the etchant.

Referring to FIG. 5, there can be seen a graph showing the change in etch angle in polycrystalline silicon versus the temperature of the mixture. The curve A shows the mixture described as mixture C above, while the curve B shows a mixture of half water and half ethylene glycol plus the same amount of KOH. The curve C shows a mixture of essentially KOH and ethylene glycol.

Figure 6:
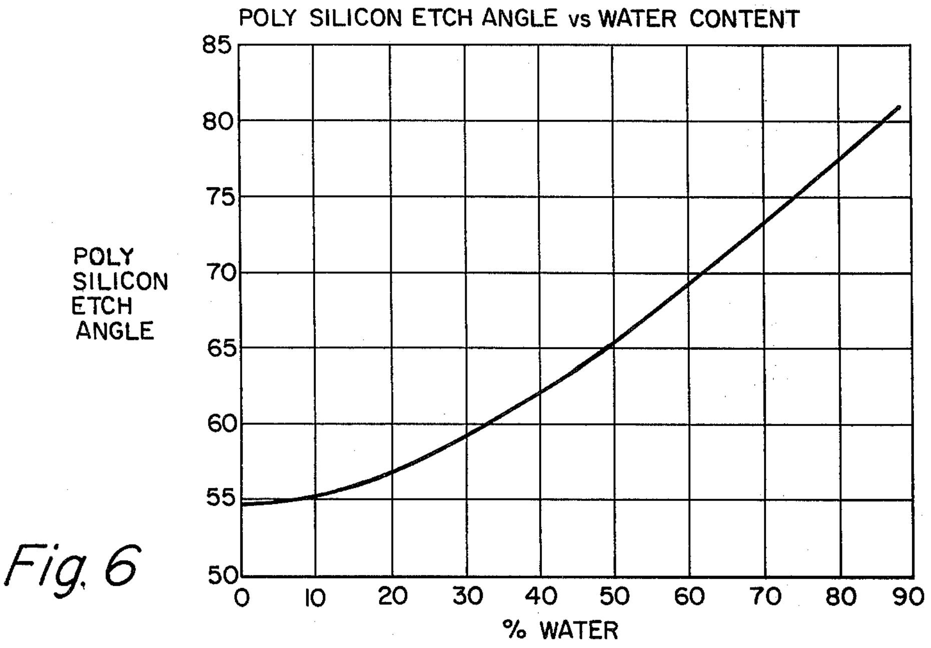
FIG. 6 shows the variation in etch angle versus percent water in the etchant.

Referring to FIG. 6 there can be shown a curve showing the change in etch angle according to the percentage of water in the mixture.

EXAMPLE I

Following is an example of steps used in etching polycrystalline silicon.

Step 1

Mix 300 grams reagent grade KOH pellets with 200cc DI $H_2O$ and stir to dissolve the pellets.

Step 2

Allow the mixture to cool to 70°C. Add 1000cc ethylene glycol and stir it to obtain a good mix.

Step 3

Maintain the temperature of the mixture to 75°C.

Step 4

Provide polycrystalline silicon wafers with 740A of dry $O_2$ grown on the surface thereof and define the gate pattern with photoresist.

Step 5

Etch the wafers for 40 seconds in room temperature buffer etch comprising 40% $NH_4F$, for example Reagent grade HF in ratios of 4:1; or 6:1 and rinse until clean.

Step 6

Clean photoresist with J-100 and give wafers a 10 minute sulfuric acid clean.

Step 7

Immerse the wafers in isopropyl alcohol for 15 seconds and go directly into the etch solution. After the bubbles stop, leave the wafers into the solution for one minute and remove. Quickly rinse in DI water.

While the times given have been found suitable for the thicknesses of the material described, it is desirable to inspect the wafers under a microscope. If traces of polycrystalline material remain, this can be removed by again immersing the wafers in isopropyl alcohol and returning the wafers to the etchant for an additional minute. Since the etchant does not attack the silicon dioxide, additional etching will not remove any of the silicon dioxide. Additionally, since the etchant attacks the polycrystalline silicon along an angle, additional etching does not otherwise change this angle.

EXAMPLE II

This process is for use with a plurality of wafers which are loaded in a wafer carrier wherein approximately 25 wafers or more can be etched at one time. These wafers are already patterned to be directly immersed into the polycrystalline silicon etch.

Step 1.

Mix 300 grams of reagents grade KOH pellets with 200cc DI $H_2O$. Stir until the pellets are dissolved.

Step 2

Allow the mixture to cool to 70°C.

Step 3

Add 800cc ethylene glycol. Stir to obtain a good mix.

Step 4

Maintain the temperature of the mixture at a temperature between the range of 70° to 75°C.

Step 5

Immerse the wafers ready for polycrystalline silicon etch in isopropyl alcohol and then directly into the etch solution.

Step 6

Leave the wafer carrier full of wafers in the etch for three minutes when using 4000A of polysilicon. The graphs shown in FIGS. 3–6 should be consulted for variations in the etching process and then rinse in just DI water.

Step 7

Inspect and re-etch if necessary to remove any remaining portions of polycrystalline silicon remaining on the wafer.

While this invention has been shown in connection with various specific examples, it will be readily apparent to those skilled in the art that various changes in form may be made to suit specific requirements without departing from the spirit and scope of the present invention.

What is claimed is:

1. An etchant for polycrystalline silicon comprising potassium hydroxide and ethylene glycol and water wherein the potassium hydroxide is 8 to 50 percent by weight of the mixture, ethylene glycol is 10 to 92 percent of the mixture and the water comprises 0–45 percent of the mixture.

2. An etchant as recited in claim 1, wherein the mixture is heated to a temperature of 70° to 85°C.

3. The method for etching polycrystalline silicon comprising the steps of:

providing an etchant mixture comprising potassium hydroxide as 8 to 50 percent of the mixture, ethylene glycol as 10 to 92 percent of the mixture and water as 0 to 45 percent of the mixture for etching the polycrystalline silicon material;

heating the mixture to a temperature within the range of 70° to 85°C; and varying the temperature of the etchant to vary the etch rate of the polycrystalline silicon.

4. The method of etching polycrystalline silicon comprising the steps of:

providing an etch mixture comprising potassium hydroxide, as 8 to 50 percent of the mixture and ethylene glycol as 10 to 92 percent of the mixture;

adding additional water to the mixture for varying the etch rate of the polycrystalline silicon material; and heating the resulting etch mixture to a fixed temperature lying within the range of 70° to 85°C.

5. The method for etching polycrystalline silicon comprising the steps of:

providing an etchant mixture comprising potassium hydroxide as 8 to 50 percent of the mixture, ethylene glycol as 10 to 92 percent of the mixture and water as 0 to 45 percent of the mixture for etching the polycrystalline silicon material;

heating the mixture to a temperature within the range of 70° to 85°C;

varying the temperature of the etchant to vary the etch rate of the polycrystalline silicon; and dipping the polycrystalline silicon being etched into isopropyl alcohol prior to etching in said heated etchant.

6. The method of etching polycrystalline silicon comprising the steps of:

providing an etch mixture comprising potassium hydroxide as 8 to 50 percent of the mixture and ethylene glycol as 10 to 92 percent of the mixture;

adding water to the mixture up to 45% of the mixture for varying the etch rate of the polycrystalline silicon material;

heating the resulting etch mixture to a fixed temperature lying within the range of 70° to 85°C; and dipping the polycrystalline silicon to be etched into isopropyl alcohol prior to being etched in said heated etchant.

* * * * *